US011392738B2

(12) United States Patent
Raichelgauz et al.

(10) Patent No.: US 11,392,738 B2
(45) Date of Patent: Jul. 19, 2022

(54) GENERATING A SIMULATION SCENARIO

(71) Applicant: AUTOBRAINS TECHNOLOGIES LTD, Tel Aviv (IL)

(72) Inventors: Igal Raichelgauz, Tel Aviv (IL); Karina Odinaev, Tel Aviv (IL)

(73) Assignee: AUTOBRAINS TECHNOLOGIES LTD, Tel Aviv (IL)

( * ) Notice: Subject to any disclaimer, the term of this patent is extended or adjusted under 35 U.S.C. 154(b) by 0 days.

(21) Appl. No.: 16/867,107

(22) Filed: May 5, 2020

(65) Prior Publication Data

US 2020/0334405 A1  Oct. 22, 2020

Related U.S. Application Data

(63) Continuation-in-part of application No. 16/544,940, filed on Aug. 20, 2019, and a continuation-in-part of application No. 16/542,327, filed on Aug. 16, 2019, now Pat. No. 10,748,038.

(60) Provisional application No. 62/843,496, filed on May 5, 2019, provisional application No. 62/827,112, filed on Mar. 31, 2019, provisional application No. 62/750,822, filed on Oct. 26, 2018.

(51) Int. Cl.
*G06F 30/27* (2020.01)
*G06K 9/62* (2022.01)
*G06V 20/59* (2022.01)

(52) U.S. Cl.
CPC ........... *G06F 30/27* (2020.01); *G06K 9/6259* (2013.01); *G06V 20/597* (2022.01)

(58) Field of Classification Search
CPC .. G06K 9/6262; G06K 9/4642; G06K 9/6228; G06K 9/6259; G06K 9/00791; G06K 9/00845; G06F 30/27; G06F 30/15
See application file for complete search history.

(56) References Cited

U.S. PATENT DOCUMENTS 6,640,015 B1   10/2003   Lafruit
7,801,893 B2    9/2010   Gulli
8,275,764 B2    9/2012   Jeon
(Continued)

OTHER PUBLICATIONS

Hoemann et al, "Learning Long-Term Situation Prediction for Automated Driving", IEEE, 2017. (Year: 2017).*
(Continued)

*Primary Examiner* — Ruiping Li
(74) *Attorney, Agent, or Firm* — Reches Patents

(57) ABSTRACT

A method for generating a simulation scenario, the method may include receiving sensed information that was sensed during driving sessions of vehicles; wherein the sensed information comprises visual information regarding multiple objects; determining, by applying an unsupervised learning process on the sensed information, driving scenario building blocks and occurrence information regarding an occurrence of the driving scenario building blocks; and generating the simulation scenario based on a selected set of driving scenario building blocks and on physical guidelines, wherein the generating comprises selecting, out of the driving scenario building blocks, the selected set of driving scenario building blocks; wherein the generating is responsive to at least a part of the occurrence information and to at least one simulation scenario limitation.

19 Claims, 2 Drawing Sheets

(56) References Cited

U.S. PATENT DOCUMENTS

| | | |
|---|---|---|
| RE44,225 E | 5/2013 | Aviv |
| 8,527,978 B1 | 9/2013 | Sallam |
| 8,634,980 B1 | 1/2014 | Urmson |
| 8,781,152 B2 | 7/2014 | Momeyer |
| 8,782,077 B1 | 7/2014 | Rowley |
| 9,298,763 B1 | 3/2016 | Zack |
| 9,440,647 B1 | 9/2016 | Sucan |
| 9,734,533 B1 | 8/2017 | Givot |
| 10,133,947 B2 | 11/2018 | Yang |
| 10,347,122 B2 | 7/2019 | Takenaka |
| 10,491,885 B1 | 11/2019 | Hicks |
| 2003/0037010 A1 | 2/2003 | Schmelzer |
| 2004/0059736 A1 | 3/2004 | Willse |
| 2004/0091111 A1 | 5/2004 | Levy et al. |
| 2004/0230572 A1 | 11/2004 | Omoigui |
| 2005/0193015 A1 | 9/2005 | Logston |
| 2006/0100987 A1 | 5/2006 | Leurs |
| 2006/0120626 A1 | 6/2006 | Perlmutter |
| 2006/0251339 A1 | 11/2006 | Gokturk |
| 2007/0196013 A1 | 8/2007 | Li |
| 2008/0109433 A1 | 5/2008 | Rose |
| 2008/0152231 A1 | 6/2008 | Gokturk |
| 2008/0166020 A1 | 7/2008 | Kosaka |
| 2008/0270569 A1 | 10/2008 | McBride |
| 2008/0294278 A1 | 11/2008 | Borgeson et al. |
| 2009/0022472 A1 | 1/2009 | Bronstein |
| 2009/0034791 A1 | 2/2009 | Doretto |
| 2009/0043818 A1 | 2/2009 | Raichelgauz |
| 2009/0080759 A1 | 3/2009 | Bhaskar |
| 2009/0216761 A1 | 8/2009 | Raichelgauz |
| 2009/0278934 A1 | 11/2009 | Ecker |
| 2010/0042646 A1 | 2/2010 | Raichelqauz |
| 2010/0082684 A1 | 4/2010 | Churchill |
| 2010/0111408 A1 | 5/2010 | Matsuhira |
| 2010/0306193 A1 | 12/2010 | Pereira |
| 2011/0029620 A1 | 2/2011 | Bonforte |
| 2011/0038545 A1 | 2/2011 | Bober |
| 2011/0246566 A1 | 10/2011 | Kashef |
| 2012/0133497 A1 | 5/2012 | Sasaki |
| 2012/0179751 A1 | 7/2012 | Ahn |
| 2013/0103814 A1 | 4/2013 | Carrasco |
| 2013/0212493 A1 | 8/2013 | Krishnamurthy |
| 2013/0226820 A1 | 8/2013 | Sedota, Jr. |
| 2014/0025692 A1 | 1/2014 | Pappas |
| 2014/0059443 A1 | 2/2014 | Tabe |
| 2014/0095425 A1 | 4/2014 | Sipple |
| 2014/0111647 A1 | 4/2014 | Atsmon |
| 2014/0201330 A1 | 7/2014 | Lozano Lopez |
| 2014/0379477 A1 | 12/2014 | Sheinfeld |
| 2015/0033150 A1 | 1/2015 | Lee |
| 2015/0117784 A1 | 4/2015 | Lin |
| 2015/0134688 A1 | 5/2015 | Jing |
| 2015/0363644 A1 | 12/2015 | Wnuk |
| 2016/0210525 A1 | 7/2016 | Yang |
| 2016/0221592 A1 | 8/2016 | Puttagunta |
| 2016/0342683 A1 | 11/2016 | Kwon |
| 2016/0357188 A1 | 12/2016 | Ansari |
| 2017/0032257 A1 | 2/2017 | Sharifi |
| 2017/0041254 A1 | 2/2017 | Agara Venkatesha Rao |
| 2017/0109602 A1 | 4/2017 | Kim |
| 2017/0255620 A1 | 9/2017 | Raichelgauz |
| 2017/0262437 A1 | 9/2017 | Raichelgauz |
| 2017/0323568 A1 | 11/2017 | Inoue |
| 2018/0081368 A1 | 3/2018 | Watanabe |
| 2018/0101177 A1 | 4/2018 | Cohen |
| 2018/0157916 A1 | 6/2018 | Doumbouya |
| 2018/0158323 A1 | 6/2018 | Takenaka |
| 2018/0204111 A1 | 7/2018 | Zadeh |
| 2019/0005726 A1 | 1/2019 | Nakano |
| 2019/0039627 A1 | 2/2019 | Yamamoto |
| 2019/0043274 A1 | 2/2019 | Hayakawa |
| 2019/0045244 A1 | 2/2019 | Balakrishnan |
| 2019/0056718 A1 | 2/2019 | Satou |
| 2019/0065951 A1 | 2/2019 | Luo |
| 2019/0147582 A1* | 5/2019 | Lee .................. G06T 11/00 382/156 |
| 2019/0155291 A1* | 5/2019 | Heit .................. B60W 30/00 |
| 2019/0188501 A1 | 6/2019 | Ryu |
| 2019/0220011 A1 | 7/2019 | Della Penna |
| 2019/0317513 A1 | 10/2019 | Zhang |
| 2019/0364492 A1 | 11/2019 | Azizi |
| 2019/0384303 A1 | 12/2019 | Muller |
| 2019/0384312 A1 | 12/2019 | Herbach |
| 2019/0385460 A1 | 12/2019 | Magzimof |
| 2019/0389459 A1 | 12/2019 | Berntorp |
| 2020/0004248 A1 | 1/2020 | Healey |
| 2020/0004251 A1 | 1/2020 | Zhu |
| 2020/0004265 A1 | 1/2020 | Zhu |
| 2020/0005631 A1 | 1/2020 | Visintainer |
| 2020/0018606 A1 | 1/2020 | Wolcott |
| 2020/0018618 A1 | 1/2020 | Ozog |
| 2020/0020212 A1 | 1/2020 | Song |
| 2020/0050973 A1 | 2/2020 | Stenneth |
| 2020/0073977 A1 | 3/2020 | Montemerlo |
| 2020/0090484 A1 | 3/2020 | Chen |
| 2020/0097756 A1 | 3/2020 | Hashimoto |
| 2020/0133307 A1 | 4/2020 | Kelkar |
| 2020/0043326 A1 | 6/2020 | Tao |

OTHER PUBLICATIONS

Jasinschi et al., A Probabilistic Layered Framework for Integrating Multimedia Content and Context Information, 2002, IEEE, p. 2057-2060. (Year: 2002).

Jones et al., "Contextual Dynamics of Group-Based Sharing Decisions", 2011, University of Bath, p. 1777-1786. (Year: 2011).

Iwamoto, "Image Signature Robust to Caption Superimpostion for Video Sequence Identification", IEEE, pp. 3185-3188 (Year: 2006).

Cooperative Multi-Scale Convolutional Neural, Networks for Person Detection, Markus Eisenbach, Daniel Seichter, Tim Wengefeld, and Horst-Michael Gross Ilmenau University of Technology, Neuroinformatics and Cognitive Robotics Lab (Year; 2016).

Chen, Yixin, James Ze Wang, and Robert Krovetz. "CLUE: cluster-based retrieval of images by unsupervised learning." IEEE transactions on Image Processing 14.8 (2005); 1187-1201. (Year: 2005).

Wusk et al (Non-Invasive detection of Respiration and Heart Rate with a Vehicle Seat Sensor; www.mdpi.com/journal/sensors; Published: May 8, 2018). (Year: 2018).

Chen, Tiffany Yu-Han, et al. "Glimpse: Continuous, real-time object recognition on mobile devices." Proceedings of the 13th ACM Confrecene on Embedded Networked Sensor Systems. 2015. (Year: 2015).

\* cited by examiner

GENERATING A SIMULATION SCENARIO

CROSS REFERENCE

This application claims priority from U.S. provisional patent 62/843,496 which is incorporated herein by reference.

This application is a continuation in part of U.S. patent application Ser. No. 16/544,940 which is incorporated herein by reference.

This application is a continuation in part of U.S. patent application Ser. No. 16/542,327 which is incorporated herein by reference.

BACKGROUND

The steadily growing number of functions for automated driving requires a powerful test environment that can handle the exponentially increasing effort for the tests in early development phases. To achieve this with utmost efficiency, a simulation-based evaluation of vehicle software for functions for highly automated driving and self-driving cars is a necessity.

Comprehensive tests of functions for automated driving require:
  The automated simulation of different traffic scenarios on a wide range of road networks and with different environmental conditions.
  A large number of tests to cover scenario variations and randomized testing.
  The simulation of millions of test kilometers.
  Consistent management of test parameters and a result analysis.
  The reuse of tests in all development phases.

Today, simulation developers provide only hundreds of kilometers of public road models, copied faithfully from the real world. This small sample of road conditions is not enough as each vehicle should be tested on millions of miles at numerous test conditions—including test conditions not covered by the hundreds of kilometers of public road models.

The manual generation of scenarios is very limited and both time and money consuming.

SUMMARY

There may be provided a method for generating a simulation scenario, the method may include receiving, from vehicles, sensed information that was sensed during driving sessions of the vehicles; wherein the sensed information may include visual information regarding multiple objects; determining, by applying an unsupervised learning process on the sensed information, driving scenario building blocks and occurrence information regarding an occurrence of the driving scenario building blocks; and generating the simulation scenario based on a selected set of driving scenario building blocks and on physical guidelines, wherein the generating may include selecting, out of the driving scenario building blocks, the selected set of driving scenario building blocks; wherein the generating is responsive to at least a part of the occurrence information and to at least one simulation scenario limitation.

The driving scenario building blocks may include behavioral information about behavioral patterns of at least some of the multiple objects.

The method may include generating the simulated scenario to comply with a behavior reflected in the behavioral information.

The method may include generating the simulated scenario to deviate from the behavior reflected in the behavioral information.

The driving scenario building blocks may include classification information about classes of at least some of the multiple objects.

The driving scenario building blocks may include path information about one or more path passed by one or more vehicles during the sensing of at least a part of the sensed information.

The driving scenario building blocks may include environmental condition information.

The generating may include selecting at least two driving scenario building blocks that do not appear in combination in the sensed information.

The method may include generating a simulation based on the simulation scenario and a video stream.

The at least one simulation scenario limitation may include physical rules.

The at least one simulation scenario limitation may include a limitation on a progress path of a vehicle.

There may be provided a non-transitory computer readable medium that may store instructions for receiving, from vehicles, sensed information that was sensed during driving sessions of the vehicles; wherein the sensed information may include visual information regarding multiple objects; determining, by applying an unsupervised learning process on the sensed information, driving scenario building blocks and occurrence information regarding an occurrence of the driving scenario building blocks; and generating the simulation scenario based on a selected set of driving scenario building blocks and on physical guidelines, wherein the generating may include selecting, out of the driving scenario building blocks, the selected set of driving scenario building blocks; wherein the generating is responsive to at least a part of the occurrence information and to at least one simulation scenario limitation.

The driving scenario building blocks may include behavioral information about behavioral patterns of at least some of the multiple objects.

The non-transitory computer readable medium may store instructions for generating the simulated scenario to comply with a behavior reflected in the behavioral information.

The non-transitory computer readable medium may store instructions for generating the simulated scenario to deviate from the behavior reflected in the behavioral information.

The driving scenario building blocks may include classification information about classes of at least some of the multiple objects.

The driving scenario building blocks may include path information about one or more path passed by one or more vehicles during the sensing of at least a part of the sensed information.

The driving scenario building blocks may include environmental condition information.

The generating may include selecting at least two driving scenario building blocks that do not appear in combination in the sensed information.

The non-transitory computer readable medium may store instructions for generating a simulation based on the simulation scenario and a video stream.

The at least one simulation scenario limitation may include physical rules.

The at least one simulation scenario limitation may include a limitation on a progress path of a vehicle.

BRIEF DESCRIPTION OF THE DRAWINGS

The embodiments of the disclosure will be understood and appreciated more fully from the following detailed description, taken in conjunction with the drawings in which.

DESCRIPTION OF EXAMPLE EMBODIMENTS

Figure 1:
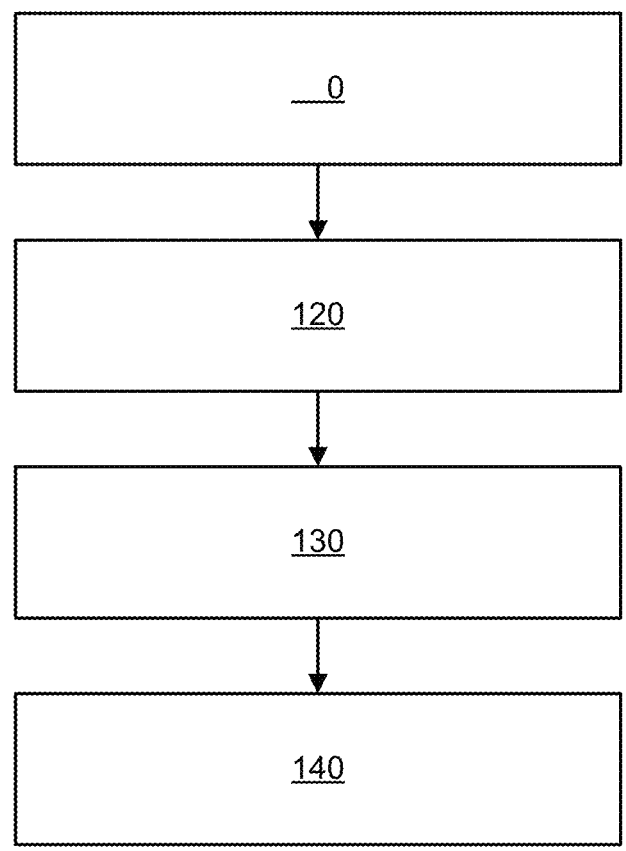
FIG. 1 illustrates an example of a method.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method and/or to a non-transitory computer readable medium that stores instructions for executing the method.

Any reference in the specification to a system or device should be applied mutatis mutandis to a method that may be executed by the system, and/or may be applied mutatis mutandis to non-transitory computer readable medium that stores instructions executable by the system.

Any reference in the specification to a non-transitory computer readable medium should be applied mutatis mutandis to a device or system capable of executing instructions stored in the non-transitory computer readable medium and/or may be applied mutatis mutandis to a method for executing the instructions.

Any combination of any module or unit listed in any of the figures, any part of the specification and/or any claims may be provided.

There may be provided a system, method and a non-transitory computer readable medium that may generate simulation scenarios that may cover a vast number of driving scenarios that are both realistic and can be generated in a highly efficient manner.

The unsupervised learning is not bound by a limited number of human fed scenarios and can adapt to changes in the behavior and appearances of objects.

FIG. 1 illustrates an example of method 100.

Method 100 may start by step 110 of receiving, from vehicles, sensed information that was sensed during driving sessions of the vehicles. The sensed information may include visual information regarding multiple objects.

The sensed information may be acquired by vehicle sensors such as image sensors, LIDARS, radars, sonars, and the like.

The sensed information may be me obtained from a vast number of vehicles over a long period of time—but this is not necessarily so. Vast may exceed 90, 100, 500, 1000, 5000, 10000, 100,000—and even more. The long period of time may exceed a week, a month, and the like. Longer periods of time and sensed information from mode different located may provide more information.

The sensed information may be vast enough to be regarded as big data—but this is not necessarily so.

Step 110 may be followed by step 120 of determining, by applying an unsupervised learning process on the sensed information, driving scenario building blocks and occurrence information regarding an occurrence of the driving scenario building blocks.

The unsupervised learning process may be preceded by a supervised stage in which areas such as road, and curve, are defined as important areas to understand where relevant agents can be located. The unsupervised process may then be applied on the sensed information. The unsupervised process may include generating signatures of sensed information units (for example media units such as images), generating cluster structures that include signatures related to each other and metadata related to the signatures, the clusters are of agents that may appear in one or more types of areas. The clustering may be performed based on visual similarity and/or behavior. This, for example will exclude airplanes or birds or above the road bridges from the scene.

The unsupervised learning may include object recognition, learning the behavior patterns of the objects, learning the classes of objects (and the behavior patterns of each class of objects), learning the paths that were passed by the vehicles during the driving sessions of the vehicles, learning the environmental conditions that existed during the driving sessions of the vehicles, and the like. These learnt items may form driving scenario building blocks.

The learning also includes calculating occurrence information regarding an occurrence of the driving scenario building blocks. The occurrence information may include statistical parameters, probability parameters and the like.

For example, step 120 may include learning at least some of the following:

Lane directions and the directions the cars are driving.
How and what speed and directions the pedestrians are moving.
Types of pedestrians—unaware pedestrians that are unaware to their surroundings (for example a pedestrian that is concentrated in his mobile phone), old people, pedestrians with a stroller, disabled pedestrians, children, and the like.
Location and/or types of traffic signs and expected behavior of vehicles and/or pedestrians when reaching a traffic sign.
Weather conditions.
Occlusions.
Types of roads, intersections, roundabouts, and the like.

Any one of the supervised learning and the unsupervised learning may include generating signatures and performing object detection and/or behavior pattern detection as illustrated in U.S. patent application Ser. No. 16/729,307, and/or as illustrated in U.S. patent application Ser. No. 16/544,940—both being incorporated herein by reference.

Step 120 may include acquiring statistics (and/or probabilistic information) regarding the frequency of various vehicle behaviors. For example:

- A vehicle is expected not to cross a red light or to drive on the sideway.
- 70% of the pedestrians cross the road only at zebra crossing.
- 55% of the pedestrians cross the road only at zebra crossing and only at a pedestrian green light.
- There is a chance of 75% that a vehicle will change its lane without signaling.

The statistics and/or probabilistic information may be obtained regardless of location, may be obtained per location, may be obtained per area (street, junction, neighborhood, city, county, state), may be obtained per type of location (crossroad, roundabout, straight path, T-junction, before traffic lights, at a unidirectional street, bidirectional street, dual lane road, four lane road, and the like).

The driving scenario building blocks may include behavioral information about behavioral patterns of at least some of the multiple objects. The behavioral information may be associated with the mentioned above statistics and/or probabilistic information.

The driving scenario building blocks may include classification information about classes of at least some of the multiple objects. The classification may include defining classes and/or sub-classes (class—for example—vehicle or pedestrian, subclass—pedestrian carrying a handbag, an old man, a child, an adult, and the like).

The driving scenario building blocks may include path information about one or more paths passed by one or more vehicles during the sensing of at least a part of the sensed information. The path information may be provided at different levels of details.

The driving scenario building blocks may include environmental condition information. For example—light conditions, humidity, visibility, rain, show, fog, and the like.

The driving scenario building blocks may include timing information (time of day, day of the week, specific date) and/or location information and/or any parameter or attribute of the vehicle that is being used in the simulation.

The driving scenario building blocks may include one or more driving events. A driving event may be a passage of an obstacle, a bypassing of an obstacle, driving at certain weather condition, driving in a curved section of a road, reacting to a presence of a zebra crossing, driving towards a crossroad, driving in a roundabout, a change in any driving parameter (acceleration, direction of propagation), turning the vehicle, bypassing a vehicle, parking, entering a scene that required a driver intervention, performing complex driving maneuvers, any driving event related to the driving that may cause a person within the vehicle to feel uncomfortable, and/or any combination of any one of the above. For example—a driving event may involve passing a bumper at a certain velocity, passing a bumper under a certain amount of rain, passing a bumper and entering a hole, and the like.

Step 120 may be followed by step 130 of generating a simulation scenario based on a selected set of driving scenario building blocks and on physical guidelines.

Step 130 may include selecting, out of the driving scenario building blocks, the selected set of driving scenario building blocks.

Step 130 may be responsive to at least a part of the occurrence information and to at least one simulation scenario limitation. Thus—the simulation scenario may follow the statistics and/or probabilistic information of the occurrence information or may deviate from the statistics and/or probabilistic information of the occurrence information.

The at least one simulation scenario limitation may impose limitations on the simulation scenario. For example—the simulation scenario limitation may impose a limit on a progress path of a vehicle—for example the vehicle can drive on road and/or on sidewalks but cannot fly or enter a building. A pedestrian can not run at a speed of 100 miler per hours, and the like.

A simulation scenario limitation may be fed to the system/process. Additionally or alternatively, a simulation scenario limitation may be determined based on statistics—for example scenarios that were not captured in the sensed information may be deemed to be irrelevant.

Assuming that the sensed information covered a certain number of combination of driving scenario building blocks then the generation of the driving scenario may include selecting combination out a much larger group of combination—by combining driving scenario building blocks to provide valid combinations that were not covered by the sensed information.

The generation of the driving scenario may include changing one or more behavioral patterns, changing the statistics and/or probability of driving events, and the like. For example—the driving scenario may be generated to introduce more vehicle that cross the red light, less vehicle that change lanes without signaling, and the like.

The generation of the driving scenario may include generating a driving scenario that is typical to a certain location or that may deviate from the typical behavior of that certain location.

The generation of the driving scenario may include generating a driving scenario that is typical to a certain topography or that may deviate from the typical behavior of that certain topography. For example—the driving over steep mountain roads may differ from the driving over a substantially flat terrain.

The selection of at least one simulation scenario may be made in any manner (random, pseudo-random, according to a predefined rule) but one or more other simulation scenario may be made as to deviate or to comply with the occurrence information.

For example—the selection may include selecting a weather condition, selecting which objects will appear in the simulation and then selecting the behavior of the objects to follow a certain probability.

The simulation may tailored to address different problems. For example—the simulation may be tailored to confront the driver with one or more problems (for example—driving in bad weather conditions, driving in heavy traffic, maneuvering between hectic drivers, approaching a traffic light, having a pedestrian jump in front of the vehicle, driving among aggressive drivers, driving in an area that exhibits higher than average violators during twilight hours, driving in a highway with a heavy traffic with lots of exits, etc). Different scenarios may be provided to test a single problem.

Step 130 may be followed by step 140 of generating a simulation based on the simulation scenario. Step 140 may be executed by well-known simulation engines such as 3D graphic acceleration engines or any other simulation engines. The simulation may simulate the scenes captured by sensors of the vehicles.

Figure 2:
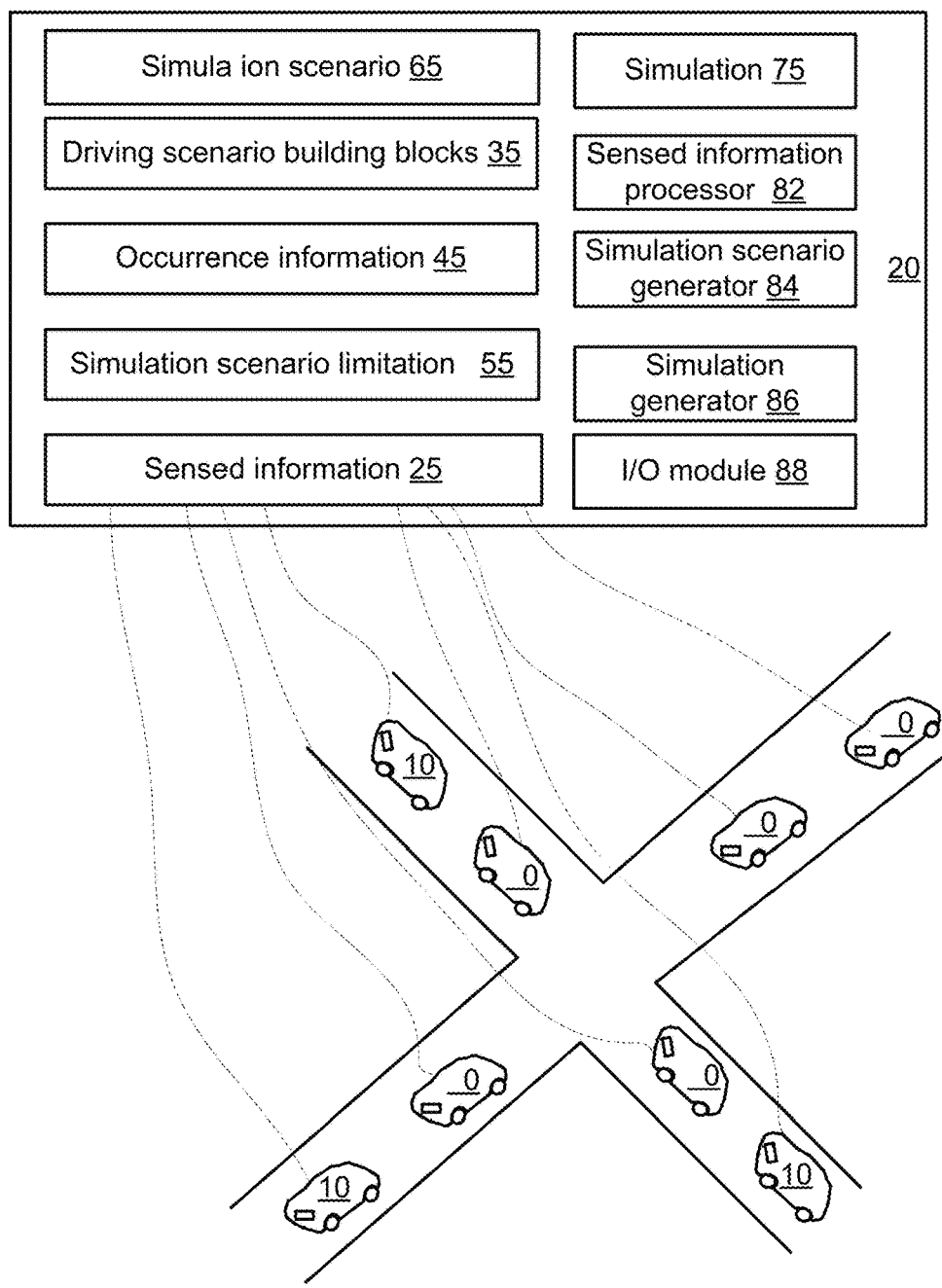
FIG. 2 illustrates an example of a computerized system.

FIG. 2 illustrates vehicles 10 that send sensed information 25 to a computerized system 20. The sensed information may include signatures and/or may be received by I/O module 88. The signatures may be compact, robust to noise, and highly accurate.

The computerized system may generate multiple simulation scenarios and/or multiple simulations.

The computerized system may store the sensed information and process it to generate occurrence information 45, driving scenario building blocks 35, simulation scenario 65 and simulation 75. The computerized system 20 may receive or generate at least one simulation scenario limitation 55.

The sensed information processor 82 may generate, based on the sensed information, the occurrence information 45 and the driving scenario building blocks 35.

The simulation scenario generator 84 may generate the simulation scenario 65 based, at least in part, on occurrence information 45, driving scenario building blocks 35 and at least one simulation scenario limitation 55.

A simulation generator 86 may generate simulation 75 based at least in part on the simulation scenario 65.

The computerized system 20 and/or each one out of simulation generator 86, simulation scenario generator 84 and sensed information processor 82 may include include one or more servers, may be executed by one or more servers, may be (or may include) one or more processing circuitry that may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

I/O module 88 may be any suitable communications component such as a network interface card, universal serial bus (USB) port, disk reader, modem or transceiver that may be operative to use protocols such as are known in the art to communicate either directly, or indirectly, with vehicles 10. I/O module 88 may be operative to use a wired or wireless connection to connect to vehicles 10 via a communications network such as a local area network, a backbone network and/or the Internet, etc.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

What is claimed is:

1. A method for generating a simulation scenario, the method comprises:
   receiving sensed information that was sensed during driving sessions of vehicles; wherein the sensed information comprises visual information regarding multiple objects;
   determining, by applying an unsupervised learning process on the sensed information, driving scenario building blocks and occurrence information regarding an occurrence of the driving scenario building blocks; and
   generating the simulation scenario based on a selected set of driving scenario building blocks and on physical guidelines, wherein the generating comprises selecting, out of the driving scenario building blocks, the selected set of driving scenario building blocks; wherein the generating is responsive to at least a part of the occurrence information and to at least one simulation scenario limitation.

2. The method according to claim 1 wherein the driving scenario building blocks comprise behavioral information about behavioral patterns of at least some of the multiple objects.

3. The method according to claim 2 comprising generating the simulated scenario to comply with a behavior reflected in the behavioral information.

4. The method according to claim 2 comprising generating the simulated scenario to deviate from the behavior reflected in the behavioral information.

5. The method according to claim 1 wherein the driving scenario building blocks comprise classification information about classes of at least some of the multiple objects.

6. The method according to claim 1 wherein the driving scenario building blocks comprise path information about one or more path passed by one or more vehicles during the sensing of at least a part of the sensed information.

7. The method according to claim 1 wherein the driving scenario building blocks comprise environmental condition information.

8. The method according to claim 1 wherein the generating comprises selecting at least two driving scenario building blocks that do not appear in combination in the sensed information.

9. The method according to claim 1 comprising generating a simulation based on the simulation scenario and a video stream.

10. The method according to claim 1 wherein the at least one simulation scenario limitation comprises physical rules.

11. The method according to claim 1 wherein the at least one simulation scenario limitation comprises a limitation on a progress path of a vehicle.

12. A non-transitory computer readable medium for generating a simulation scenario, the non-transitory computer readable medium stores instructions for:
   receiving sensed information that was sensed during driving sessions of vehicles; wherein the sensed information comprises visual information regarding multiple objects;
   determining, by applying an unsupervised learning process on the sensed information, driving scenario building blocks and occurrence information regarding an occurrence of the driving scenario building blocks; and
   generating the simulation scenario based on a selected set of driving scenario building blocks and on physical guidelines, wherein the generating comprises selecting, out of the driving scenario building blocks, the selected set of driving scenario building blocks; wherein the generating is responsive to at least a part of the occurrence information and to at least one simulation scenario limitation.

13. The non-transitory computer readable medium according to claim 12 wherein the driving scenario building blocks comprise behavioral information about behavioral patterns of at least some of the multiple objects.

14. The non-transitory computer readable medium according to claim 13 that stores instructions for generating the simulated scenario to comply with a behavior reflected in the behavioral information.

15. The non-transitory computer readable medium according to claim 13 that stores instructions for generating the simulated scenario to deviate from the behavior reflected in the behavioral information.

16. The non-transitory computer readable medium according to claim 12 wherein the driving scenario building blocks comprise classification information about classes of at least some of the multiple objects.

17. The non-transitory computer readable medium according to claim 12 wherein the driving scenario building blocks comprise path information about one or more path passed by one or more vehicles during the sensing of at least a part of the sensed information.

18. The non-transitory computer readable medium according to claim 12 wherein the driving scenario building blocks comprise environmental condition information.

19. The non-transitory computer readable medium according to claim 12 wherein the generating comprises selecting at least two driving scenario building blocks that do not appear in combination in the sensed information.

* * * * *